United States Patent
Hara et al.

(10) Patent No.: US 8,780,329 B2
(45) Date of Patent: Jul. 15, 2014

(54) EXPOSURE APPARATUS, STRUCTURE, METHOD FOR SETTING UP APPARATUS, AND DEVICE MANUFACTURING METHOD HAVING FILLING MEMBER FORMED BY HARDENING LIQUID TO SUPPORT SETTING LEG

(75) Inventors: Hiromichi Hara, Utsunomiya (JP); Yasuyo Kawabata, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 1322 days.

(21) Appl. No.: 12/341,412

(22) Filed: Dec. 22, 2008

(65) Prior Publication Data
US 2009/0168036 A1     Jul. 2, 2009

(30) Foreign Application Priority Data
Dec. 28, 2007 (JP) .................................. 2007-341373

(51) Int. Cl.
*G03B 27/32* (2006.01)
*G03F 7/20* (2006.01)

(52) U.S. Cl.
CPC ............ *G03F 7/70833* (2013.01); *G03F 7/709* (2013.01)
USPC .......................................................... 355/77

(58) Field of Classification Search
CPC .............................. G03F 7/70833; G03F 7/709
USPC ....................................................... 355/77, 53
See application file for complete search history.

(56) References Cited

U.S. PATENT DOCUMENTS 6,493,062 B2    12/2002  Tokuda et al.

FOREIGN PATENT DOCUMENTS

| GB | 1489950 | * 10/1977 | ............... F16M 5/00 |
| JP | 11-297587 A | 10/1999 | |

* cited by examiner

*Primary Examiner* — Chia-how Michael Liu
(74) *Attorney, Agent, or Firm* — Canon USA, Inc. IP Division (57) ABSTRACT

An exposure apparatus of the present invention is configured to expose a pattern on an original onto a wafer via a projection lens system 110. The exposure apparatus includes a setting leg 105, platens 103, 107, and 109 on which at least one of a reticle stage apparatus 108 configured to hold the original, the projection optical system 110, a wafer stage apparatus 102 configured to hold the wafer, and an interferometer configured to measure a position of the original stage or the wafer stage is mounted, a vibration isolation support mechanism 105 which is provided between the platens 103, 107, and 109 and the setting leg 105 and configured to reduce a vibration, and a filling member 122 formed by hardening a hardening type liquid 113 which is filled between the setting leg 105 and a setting floor 101.

7 Claims, 6 Drawing Sheets

PRIOR ART

EXPOSURE APPARATUS, STRUCTURE, METHOD FOR SETTING UP APPARATUS, AND DEVICE MANUFACTURING METHOD HAVING FILLING MEMBER FORMED BY HARDENING LIQUID TO SUPPORT SETTING LEG

BACKGROUND OF THE INVENTION

1. Field of the Invention

The present invention relates to an exposure apparatus, a structure, a method for setting up an apparatus, and a device manufacturing method, which are particularly suitably used for a semiconductor manufacturing apparatus, a liquid crystal substrate manufacturing apparatus, a magnetic head manufacturing apparatus, and a micromachine manufacturing apparatus.

2. Description of the Related Art

Recently, in accordance with high integration of semiconductor devices, the resolution required for a semiconductor exposure apparatus is higher. In order to improve the resolution, NA (numerical aperture) equal to or greater than 0.9 is required for a projection optical system. Therefore, the projection optical system is getting larger. Furthermore, in order to improve the performance, it is necessary to suppress a disturbance such as a vibration. As a result, in order to improve the stiffness of the apparatus, the apparatus gets larger and the weight of the apparatus also increases.

Figure 5:
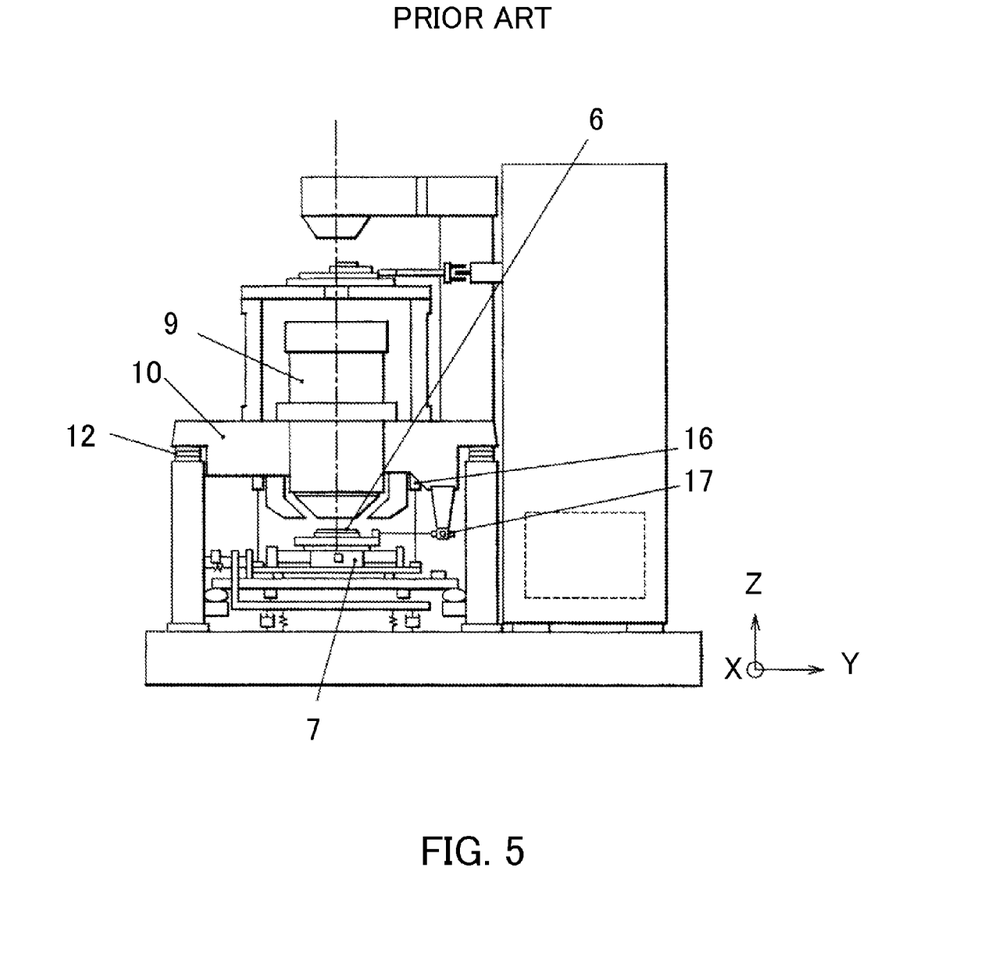
FIG. 5 is a schematic view of a conventional exposure apparatus.

FIG. 5 is a configuration of an exposure apparatus which is disclosed in Japanese Patent Laid-Open No. 11-297587. A lens-barrel platen 10 which supports a projection optical system 9 is supported by an active mount 12 including an actuator for reducing a vibration. A Z-interferometer 16 and an XY-interferometer 17 for measuring a position of a wafer stage 7 which mounts a wafer 6 are attached to the lens-barrel platen 10.

The Z-interferometer 16 and the XY-interferometer 17 measure a relative position of the wafer stage 7 with respect to the projection optical system 9. Based on the measurement result, the wafer stage 7 is positioned. The active mount 12 is supported on an apparatus support leg and the apparatus support leg is directly supported on an apparatus setting floor.

As described above, in a method for directly setting up the apparatus on the setting floor, the floor is subducted by the increase of the weight of the apparatus in accordance with growth in size of the apparatus and by the point contact between the setting leg of the apparatus and the setting floor caused by a local irregularity of the floor surface. Usually, since the floor on which the apparatus is set up is made of concrete, in the case of the point contact, the force acting on the concrete may exceed a load capacity or an intensity of the concrete. The subduction amount is different by the difference of the load distribution of the apparatus or the difference of the state of the floor, and an ideal apparatus attitude can not be duplicated. Furthermore, when the subduction of the floor occurs, the attitude of the apparatus changes and a distortion such as a twist of the structure of the main body of the exposure apparatus occurs, which is led to the performance degradation.

Recently, in order to respond to a miniaturization requirement which is required for the semiconductor exposure apparatus, the requirement for the vibration environment is stricter. In particular, an exposure apparatus called a scanner synchronously scans a wafer stage placing a semiconductor wafer and a reticle scan stage placing a reticle that is an original of a circuit pattern in opposite directions to each other with a predetermined velocity ratio, and the exposure is performed during the scan. Therefore, when the disturbance due to a vibration occurs in the synchronous scan, the quality of manufactured ICs is significantly deteriorated. In other words, the scanner is extremely sensitive to the vibration of the floor on which the scanner is set up, or the like.

Conventionally, with respect to the vibration of the floor in a clean room where the semiconductor exposure apparatus is set up, it is considered that a basis called a pedestal is laid and the overall exposure apparatus is set up on it. However, even if the pedestal which has a large amount of weight and an appropriate decay action is laid in order to reduce the vibration which intrudes into the scanner, the intrusion of the vibration can not be fully blocked. Furthermore, a setting surface of the setting leg part of the apparatus jounces and a vibration problem occurs because of the local irregularity of the setting floor surface. This vibration is transmitted to the interferometer or the projection optical system in the main body of the exposure apparatus from the setting leg. In other words, the vibration from the setting floor can not be adequately reduced by the active mount equipped with the conventional exposure apparatus, and it is transmitted to each unit of the exposure apparatus via the setting leg and the platen. This negatively affects the positioning accuracy of the wafer stage which controls the position so that the signal from the interferometer indicates a target value or the exposure performance of the projection optical system.

In the latest pedestal, although the irregularity of the concrete surface may be smoothed by machining or polishing, there is a problem that it takes extremely much cost and lead time. Furthermore, the pedestal can be processed only when it is alone before it is set up in the clean room. Therefore, if the overall pedestal is tilted at the time of setting up the pedestal in the clean room, the setting surface of the apparatus is also tilted. In this case, the main body of the semiconductor exposure apparatus usually performs a leveling using a level. Therefore, if the overall pedestal is tilted, the setting leg of the apparatus and the setting surface of the pedestal are in contact with each other by a point after all.

The apparatus needs to keep an initial setting state for a long time. Generally, in the case of a large apparatus, there is great possibility that the setting floor is subducted because the weight of the apparatus is great. Furthermore, the change of the floor with the passage of time is also concerned by using the apparatus for a long time.

BRIEF SUMMARY OF THE INVENTION

The present invention was made in view of the above problems, and provides an exposure apparatus which can reduce a subduction amount of the floor by the weight of the apparatus and a generation of the vibration by the irregularity of the floor and can easily obtain the reproducibility of the attitude of the apparatus and the keeping of the attitude. Furthermore, the present invention provides a device manufacturing method for manufacturing high-quality devices using the exposure apparatus.

An exposure apparatus as one aspect of the present invention is an exposure apparatus configured to expose a pattern on an original onto a substrate via a projection optical system. The exposure apparatus includes a setting leg, a platen on which at least one of an original stage configured to hold the original, the projection optical system, a substrate stage configured to hold the substrate, and an interferometer configured to measure a position of one of the original stage and the substrate stage is mounted, a mount which is provided between the platen and the setting leg and configured to reduce a vibration, and a filling member formed by hardening a hardening type liquid which is filled between the setting leg and a setting floor.

An exposure apparatus as another aspect of the present invention is an exposure apparatus configured to expose a pattern of an original onto a substrate via a projection optical system. The exposure apparatus includes a setting leg, a load distribution plate made of a metal or a resin on which the setting leg is set up, and a filling member formed by hardening a hardening type liquid which is filled between the load distribution plate and a setting floor.

A structure as another aspect of the present invention is a structure configured to set up an apparatus on a setting floor. The structure includes a load distribution plate made of a metal or a resin, and a filling member formed by hardening a hardening type liquid which is filled between the load distribution plate and the setting floor.

A method for setting up an apparatus on a setting floor as another aspect of the present invention includes the steps of holding the load distribution plate by inserting a bolt into a load distribution plate and contacting the bolt with the setting floor, adjusting a leveling of the load distribution plate, filling a hardening type liquid between the load distribution plate and the setting floor, and setting up the apparatus on the load distribution plate after hardening the hardening type liquid.

A device manufacturing method as another aspect of the present invention includes the steps of exposing a pattern of an original onto a substrate using the exposure apparatus as described above, and developing the exposed substrate.

Further features and aspects of the present invention will become apparent from the following description of exemplary embodiments with reference to the attached drawings.

DETAILED DESCRIPTION OF THE PREFERRED EMBODIMENTS

Exemplary embodiments of the present invention will be described below with reference to the accompanied drawings.

Embodiment 1

Figure 1:
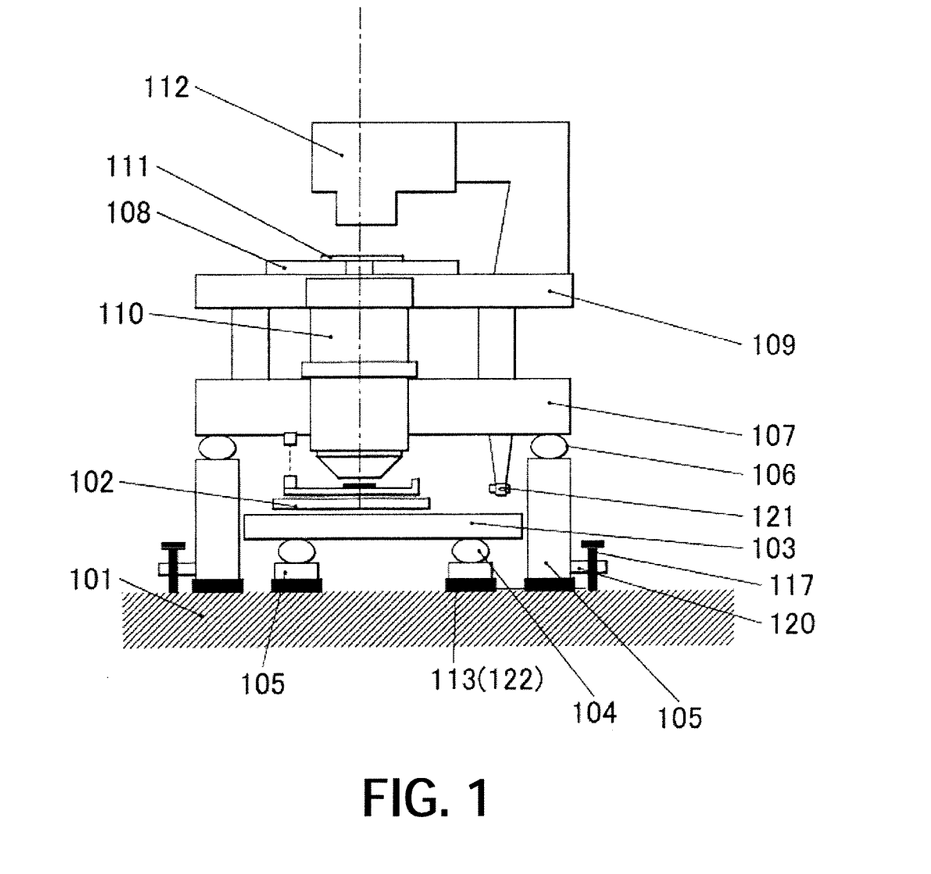
FIG. 1 is a schematic configuration diagram of a semiconductor exposure apparatus in Embodiment 1.

FIG. 1 is a schematic diagram of an exposure apparatus in Embodiment 1 of the present invention.

The exposure apparatus of the present embodiment is set up on a setting floor 101 such as a concrete floor in a clean room. A stage platen 103 which mounts a wafer stage apparatus (a substrate stage) 102 is set up above the setting floor 101 via a vibration isolation support mechanism (a mount) 104.

A lens-barrel platen 107 is set up at a setting leg 105 of the exposure apparatus via a vibration isolation support mechanism (a mount) 106. The lens-barrel platen 107 mounts a reticle stage platen 109 on which a reticle stage apparatus (an original stage) 108 is set up and a projection lens system 110. The projection lens system 110 is a projection optical system which is configured to project and expose a circuit pattern of a reticle 111 (an original) placed on the reticle stage apparatus 108 onto a silicon waver (a substrate).

An interferometer 121 configured to measure a position of the wafer stage apparatus 102 which mounts the silicon wafer is attached to the lens-barrel platen 107. A relative position of the wafer stage apparatus 102 with respect to the projection lens system 110 is measured by the interferometer 121, and based on the measurement result, the wafer stage apparatus 102 is positioned.

The setting floor 101 functions as a reference for maintaining the relative position relationship between devices which are mounted on the vibration isolation support mechanism 104 or the vibration isolation support mechanism 106 and other devices (not shown) which are not mounted on the vibration isolation support mechanism 104 or the vibration isolation support mechanism 106.

The projection lens system 110 as a projection optical system is positioned between the reticle stage apparatus 108 and the wafer stage apparatus 102. Exposure light from an illumination optical system 112 irradiates the reticle 111. The exposure light transmitting the reticle 111 is projected on the silicon wafer on the wafer stage apparatus 102 via the projection lens system 110. Thus, the circuit pattern on the reticle 111 is projected on the silicon wafer on the wafer stage apparatus 102 and the circuit pattern is formed on the silicon wafer.

A semiconductor exposure apparatus is categorized according to the exposure method such as a one-shot exposure type (a stepper) or a scanning exposure type (a scanner). In the case of the one-shot exposure type exposure apparatus, while the wafer stage apparatus 102 is sequentially driven by an intermittent operation method which is called a "step-and-repeat", a predetermined exposure area such as an area corresponding to one integrated circuit such as an IC is exposed by one shot. On the other hand, in the case of the scanning exposure type exposure apparatus, the wafer stage apparatus 102 and the reticle stage apparatus 108 are synchronously operated, and the circuit pattern on the reticle is scanned and exposed onto the wafer.

The vibration isolation support mechanism 104 may be unnecessary for the wafer stage apparatus 102 with high performance in order to achieve a predetermined performance. In the apparatus, the stage platen 103 and the wafer stage apparatus 102 are set up above the setting floor 101 without providing the vibration isolation support mechanism 104.

Similarly, the reticle stage apparatus 108 has been also sophisticated. When applying the reticle stage apparatus 108 with high performance, the reticle stage apparatus 108 may also be mounted at a structure which is not supported by the vibration isolation support mechanism 106, which is different from the projection lens system 110 or the lens-barrel platen 107.

As described later, in the present embodiment, a semiconductor exposure apparatus configured to reduce a subduction amount of the floor by a weight of the apparatus and a vibration generation by the irregularity of the floor, and to obtain the reproducibility of the attitude of the apparatus and the keeping of the attitude, and furthermore to obtain a method for adjusting the attitude will be described.

Generally, the semiconductor exposure apparatus is set on the setting floor 101 made of a concrete called a pedestal which is set in a clean room in semiconductor manufacturing facilities.

As shown in FIG. 1, in the semiconductor exposure apparatus of Embodiment 1, a gap between the setting leg 105 of the exposure apparatus and the setting floor 101 is filled with a filling member 122. The filling member 122 is formed by hardening a hardening type liquid 113 which is filled between the setting leg 105 and the floor. The filling of the hardening type liquid 113 is performed at the time of mounting the exposure apparatus on the setting floor 101 or during the time after mounting the exposure apparatus and before operating the apparatus.

The hardening type liquid is a liquid which is configured to be hardened by the passage of time. As the hardening type liquid, for example, there is a two-liquid reactive hardening type resin which chemically reacts two liquids of a main agent and a hardening agent to be hardened, a dry hardening type resin which is hardened by volatizing water or solvent, or a moisture hardening type resin which is hardened by a chemical reaction with water. Cement can also be used as the hardening type liquid. The filling member 122 is formed by hardening the hardening type liquid 113.

When the hardening type liquid 113 which is inserted into a gap between under the setting leg 105 of the exposure apparatus and the setting floor 101 is hardened, the attitude of the exposure apparatus may change by contraction of the hardening type liquid 113 or the like. In order to avoid the change of the attitude, a bracket 120 is attached to the setting leg 105 of the exposure apparatus, and a holding member 117, which fixes the bracket 120 with respect to the setting floor 101 and holds the attitude of the exposure apparatus, is provided.

For example, a bolt is used as the holding member 117. In this case, a tap hole is formed at the bracket 120. The bolt is inserted and screwed into the tap hole. The change of the attitude of the exposure apparatus can be effectively avoided by a contact of the apex of the bolt with the setting floor. The height of the setting leg 105 of the exposure apparatus can be freely adjusted by a let-off amount. After the height of the setting leg 105 of the exposure apparatus is determined by the bolt, the gap between the setting leg 105 of the exposure apparatus and the setting floor 101 is filled with the hardening type liquid 113. The holding member 117 can be another means different from the bolt if it can keep an initial attitude of the setting leg 105 of the exposure apparatus.

The bolt as the holding member 117 is removed after the hardening type liquid 113 is hardened. However, if needed, the bolt can also be remained so as to fix the bracket 120 with respect to the setting floor 101 without removing the bolt after the hardening type liquid 113 is hardened.

The hardening type liquid 113 which fills the gap between the setting leg 105 and the setting floor 101 is for example a two-liquid type epoxy adhesive (an epoxy resin) or a coating agent. The hardening type liquids including other hardening type liquids can be arbitrarily selected in accordance with the usage environment.

The setting floor 101 is a floor made of concrete and usually has an irregularity in the range of around 1 to 5 mm. Therefore, the setting leg 105 of the exposure apparatus is supported by a point at a convex part on the setting floor 101 and a gap is generated between the setting leg 105 and the setting floor 101. However, the load of the exposure apparatus can be supported by a large area of the setting floor 101 by filling the gap between the setting leg 105 and the setting floor 101 by the hardening type liquid 113 such as an epoxy adhesive.

Usually, the thickness of the coating of the adhesive is in the range of around 1 to 5 mm. An elastic modulus 30 GPa of concrete with respect to an elastic modulus around 200 GPa of steel is around ⅐. Therefore, like the conventional apparatus, when the setting leg 105 of the exposure apparatus is supported by a point at a convex part on the setting floor 101, usually, a vibration of a frequency in the range of tens of Hz (hertz) occurs by the elasticity of concrete of the point support and the performance of the exposure apparatus is negatively influenced.

On the other hand, in the present embodiment, the gap between the setting leg 105 of the exposure apparatus and the setting floor 101 is filled with the hardening type liquid 113 such as an epoxy adhesive. Therefore, the setting leg 105 of the exposure apparatus is supported by a surface of the setting floor 101 via the hardening type liquid 113. Therefore, the support stiffness (frequency) at the support part of the setting leg 105 of the exposure apparatus is improved, and at the same time, the negative influence of the vibration can be reduced by the decay effect of the hardening type liquid 113 (the filling member 122)

In the present embodiment, at least one of the wafer stage apparatus 102, the reticle stage apparatus 108, the projection optical system (the projection lens system 110), and the interferometer 121 may be directly or indirectly mounted on the setting leg 105.

Embodiment 2

Figure 2:
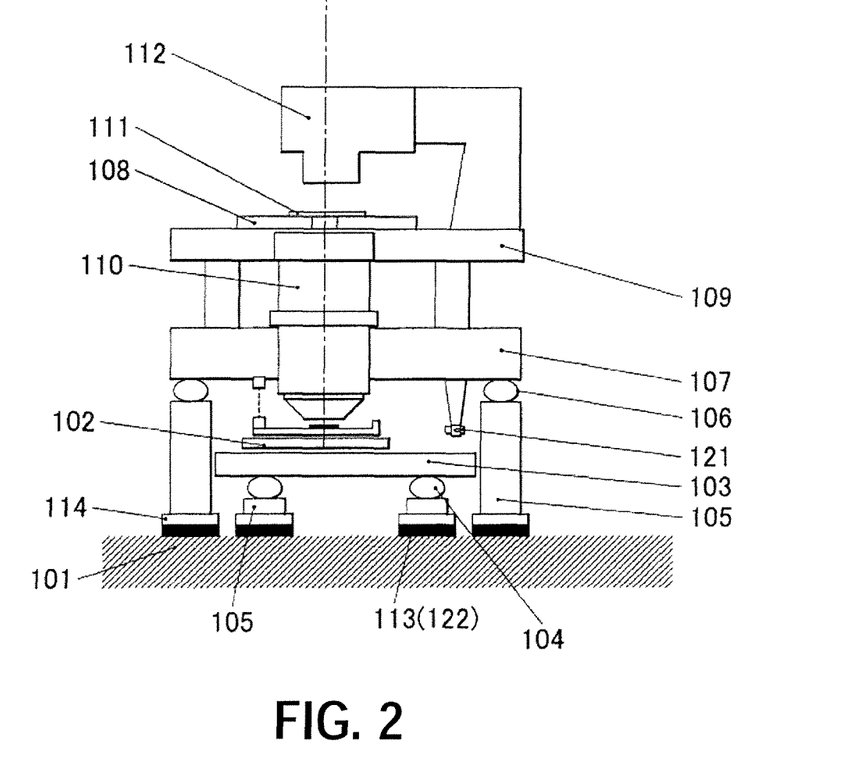
FIG. 2 is a schematic configuration diagram of a semiconductor exposure apparatus in Embodiment 2.

FIG. 2 is a schematic diagram of an exposure apparatus in Embodiment 2 of the present invention.

As shown in FIG. 2, in the semiconductor exposure apparatus of the present embodiment, a flat load distribution plate 114 for receiving the load of the apparatus is provided under the setting leg 105 of the exposure apparatus. Furthermore, a gap between the load distribution plate 114 and the setting floor 101 is filled with the filling member 122 formed by hardening the hardening type liquid 113. The load distribution plate 114 and the filling member 122 (the hardening type liquid 113) constitute a support structure (a structure) for supporting the apparatus. Thus, the present embodiment is different from Embodiment 1 in that the support structure is previously set on the setting floor 101.

According to the present embodiment, the work of contacting the setting floor 101 and the load distribution plate 114 can be completed before the exposure apparatus is set up by previously setting up the support structure including the load distribution plate 114 and the filling member 122 on the setting floor 101.

At the time of hardening the hardening type liquid 113 (the adhesive), since an epoxy resin generates harmful gas such as amine gas, it is desirable that a chamber for segregating the working place of adhesion from other atmospheres before the exposure apparatus is set up, an exhaust equipment of the harmful gas, and the like are provided. Thus, the work of adhesion can be completed without negatively influencing other environments.

As the load distribution plate 114, a member which has properties of good flatness, for example, a member made of metal such as stainless steel and aluminum or made of resin is used. The thickness of the load distribution plate 114 is usually in the range of around 1 to 10 mm. The thickness of the load distribution plate 114 is properly selected in accordance with the load or the like of the exposure apparatus which is mounted.

Figure 3A:
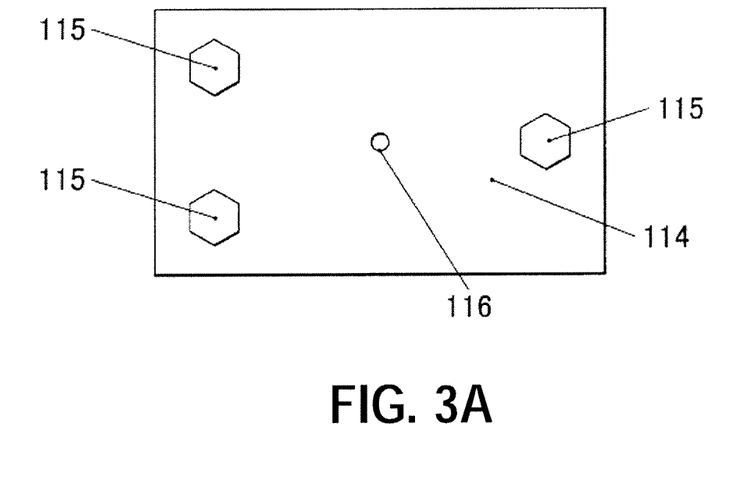
FIGS. 3A and 3B are plan views showing a schematic configuration of a load distribution plate.
Figure 3B:
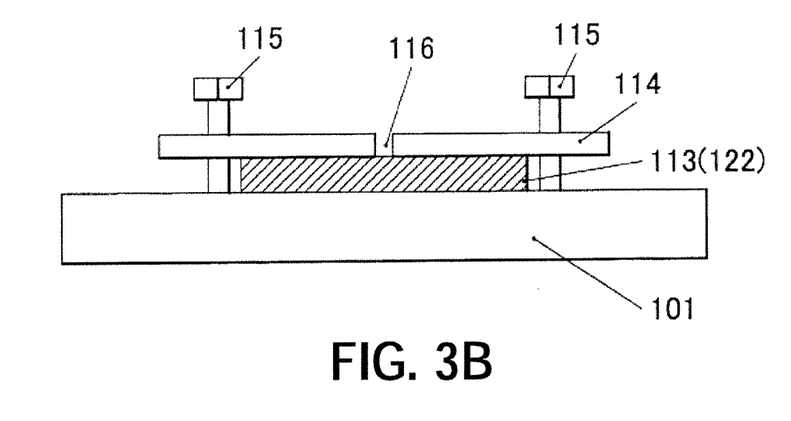

FIG. 3A is a plan view showing the schematic configuration of the load distribution plate 114 and FIG. 3B is a side view of the load distribution plate 114.

As shown in FIGS. 3A and 3B, it is preferable that the load distribution plate 114 is provided with an air hole 116. The air hole 116 is provided so that the air does not enter a filling part (an adhesion layer) of the hardening type liquid by releasing the air through the air hole 116 at the time of filling the hardening type liquid 113 (the adhesive) or at the time of work for adhesion. One or a plurality of air holes 116 can be provided if needed. As the hardening type liquid 113 of the present invention, similarly to Embodiment 1, a dry hardening type resin, a moisture hardening type resin, or a two-liquid reactive hardening type resin is used.

The support structure of the present embodiment has a bolt 115 for holding the load distribution plate 114 with respect to the setting floor 101 at the time of hardening the hardening type liquid 113. The load distribution plate 114 is provided with two or more bolt holes. The bolt 115 is screwed and inserted into the bolt hole. The attitude of the load distribution plate 114 can be held and fixed by thrusting the bolt 115 to the setting floor 101 at the time of hardening (at the time of adhering) the hardening type liquid 113 (the adhesive). In this time, the level or the tilt of the load distribution plate 114 can be arbitrarily determined by positioning a level on the load distribution plate 114 in order to adjust the tilt. If there are a plurality of load distribution plates 114, the height of each of the load distribution plates 114 can be aligned by the bolt adjustment by using a laser marker or the like.

The bolt 115 for the height adjustment is removed after the hardening type liquid 113 is hardened. By removing the bolt 115, the load distribution plate 114 is supported only by the filling member 122 (the hardening type liquid 113) with respect to the setting floor 101. In this case, the decay effect of the filling member 122 can also be obtained and the vibration can also be reduced. However, if needed, after the hardening type liquid 113 is hardened, the load distribution plate 114 can also be fixed with respect to the setting floor 101 as it is without removing the bolt 115.

The load distribution plate 114 may be fastened to an anchor nut or an anchor bolt which is opened at the setting floor 101 using a bolt or a nut.

The setting leg 105 of the exposure apparatus is placed on the load distribution plate 114, is fastened by the bolt, or is adhered by the adhesive.

Figure 4A:
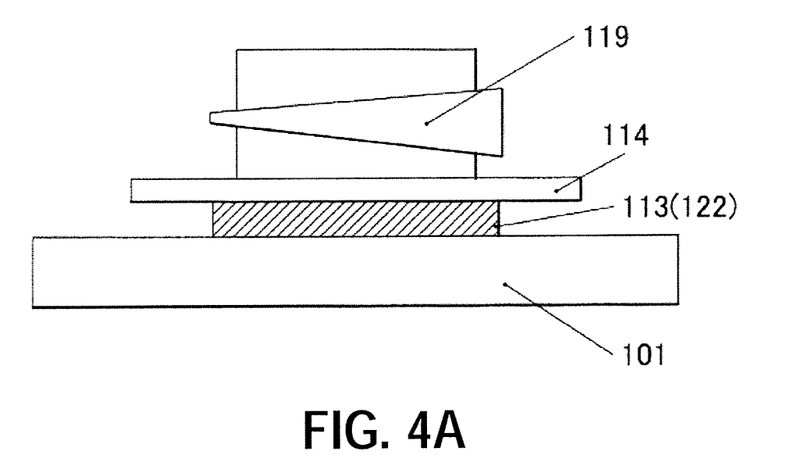
FIG. 4A is a schematic configuration diagram of a height adjusting member of a wedge structure on a load distribution plate.
Figure 4B:
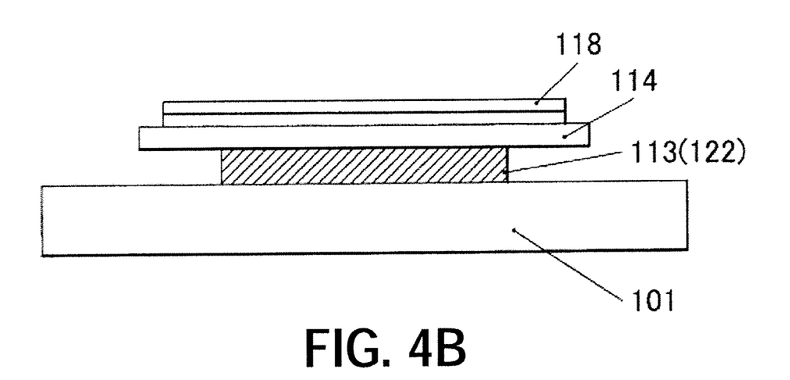
FIG. 4B is a schematic configuration diagram of a spacer of a thin plate on a load distribution plate.

As shown in FIGS. 4A and 4B, a height adjusting member for adjusting the height can be provided between the load distribution plate 114 and the setting leg 105. FIG. 4A is a side view in the case where the height adjusting member 119 with a wedge structure is provided on the load distribution plate 114. FIG. 4B is a side view in the case where a thin plate spacer 118 is provided on the load distribution plate 114. However, the height adjusting member 119 with the wedge structure shown in FIG. 4A and the thin plate spacer 118 shown in FIG. 4B are examples as a height adjusting member, and other height adjusting members with different structures can also be adopted.

Thus, by providing the height adjusting member between the load distribution plate and the setting leg, a fine adjustment of the height and the attitude of the exposure apparatus can be performed, and furthermore, the adjustment of the height and the attitude of the exposure apparatus can be easily performed.

Figure 6:
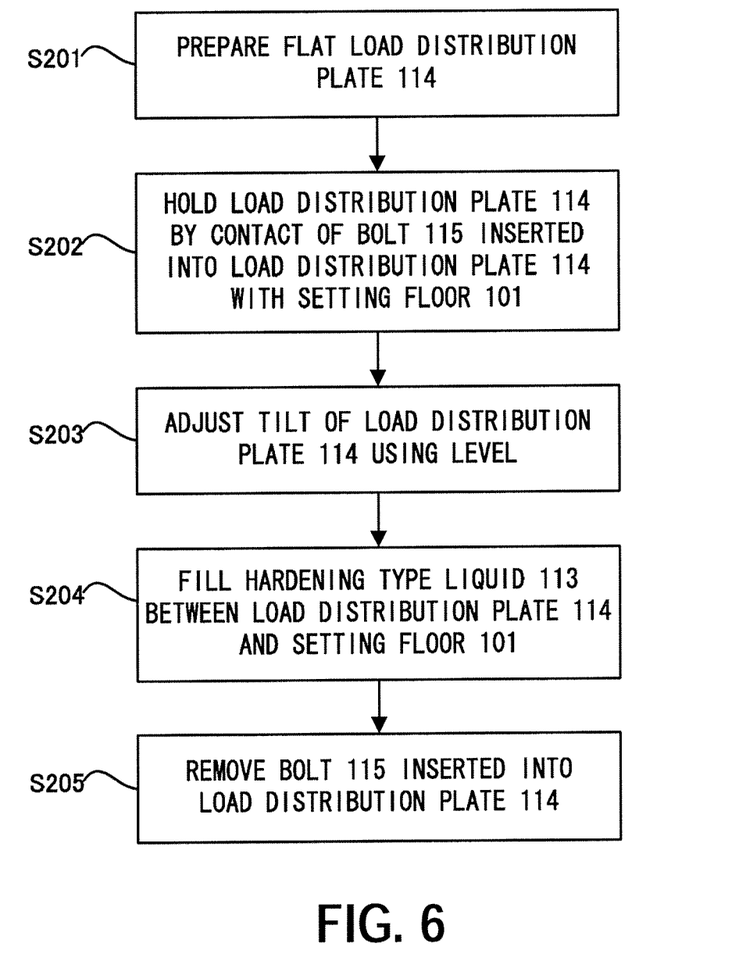
FIG. 6 is a flowchart showing a method for forming a support structure in Embodiment 2.

Next, a method for forming a support structure of the present embodiment is described with reference to FIG. 6. FIG. 6 is a flowchart showing the method for forming the support structure.

First, a flat load distribution plate 114 made of metal or resin is provided (Step S201). The load distribution plate 114 which has flatness better than that of a concrete floor is used.

Next, the load distribution plate 114 is held by inserting the bolt 115 into the load distribution plate 114 and by contact of the bolt 115 with the setting floor 101 (Step S202). As described above, the distance between the setting floor 101 and the load distribution plate 114 can be adjusted by the bolt 115.

When the load distribution plate 114 is held by the bolt 115, the leveling (tilt) of the load distribution plate 114 is adjusted using the level (Step S203). The load distribution plate 114 is adjusted in a horizontal attitude so that the apparatus is supported by the surface of the load distribution plate 114.

Next, the hardening type liquid 113 is filled between the load distribution plate 114 and the setting floor 101 (Step S204). When the hardening type liquid 113 is hardened, the load distribution plate 114 is fixed by the hardening type liquid 113 (the filling member 122). After the hardening type liquid 113 is hardened, the bolt 115 inserted into the load distribution plate 114 is removed (Step S205). However, if needed, the bolt 115 may also remain to be inserted into the load distribution plate 114 without removing the bolt 115.

As described above, in the present embodiment, similarly to Embodiment 1, the gap between the load distribution plate 114 and the setting floor 101 is filled with the hardening type liquid 113 such as the epoxy adhesive. In the configuration, the setting leg 105 of the exposure apparatus is supported by the surface of the load distribution plate 114. Therefore, the support stiffness (frequency) of the setting leg 105 of the apparatus placed on the load distribution plate 114 is improved. Furthermore, by the decay effect by the hardening type liquid 113 (the filling member 122) such as the epoxy adhesive, the negative influence by the vibration can be reduced.

Furthermore, according to the present embodiment, before the exposure apparatus is set up, the adjustment of the height and the tilt of the load distribution plate 114 can be completed. Therefore, compared to Embodiment 1, further, the setup of the exposure apparatus is easier and the setup time can be shortened.

In the present embodiment, it is described that the support structure including the load distribution plate and the filling member supports the exposure apparatus. However, the support structure of the present embodiment is not limited to the structure for supporting the exposure apparatus. It can also be used for supporting apparatuses other than the exposure apparatus.

A device (a semiconductor integrated circuit device, a liquid crystal display device, or the like) is manufactured by passing a process of exposing a substrate (a wafer, a glass plate, or the like) coated by a photosensitizing agent using the exposure apparatus of the above embodiment, a process of developing the substrate, and other well-known processes.

As described above, according to each of the above embodiments, a support structure and an exposure apparatus which can reduce a subduction amount of the floor by the weight of the apparatus and a generation of the vibration by the irregularity of the floor and can easily obtain the reproducibility of the attitude of the apparatus and the keeping of the attitude can be provided. Furthermore, a device manufacturing method for manufacturing high-quality devices using the exposure apparatus can be provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-341373, filed on Dec. 28, 2007, which is hereby incorporated by reference herein in its entirety.

What is claimed is:

1. An exposure apparatus configured to expose a pattern on an original onto a substrate via a projection optical system, the exposure apparatus comprising:
   a plurality of load distribution plates for which a leveling adjustment has been performed;
   a setting leg which is set up on each of the load distribution plates;
   a platen on which an original stage configured to hold the original, the projection optical system, a substrate stage configured to hold the substrate, or a combination of some or all of the original stage, the projection optical system and the substrate stage is mounted;
   a mount which is provided between the platen and the setting leg and configured to reduce a vibration; and
   a filling member formed by filling and hardening a hardening type liquid between each of the load distribution plates and a setting floor after the leveling adjustment is performed by a bolt which holds each of the load distribution plates with respect to the setting floor,
   wherein the load distribution plates are made of a metal, and
   wherein the load distribution plate is provided with a hole for releasing an air between the load distribution plate and the filling member at the time of filling the hardening type liquid, at a position contacting the setting leg.

2. An exposure apparatus according to claim 1, further comprising a height adjusting member which is provided between the load distribution plate and the setting leg.

3. An exposure apparatus according to claim 1, wherein the hardening type liquid is at least one of a dry hardening type resin, a moisture hardening type resin, and a two-liquid reactive hardening type resin.

4. A method for setting up an apparatus on a setting floor, comprising:
   holding a plurality of load distribution plates with respect to the setting floor by contacting a bolt with the setting floor;
   adjusting a leveling of the plurality of load distribution plates by the bolt to align height of each of the load distribution plates;
   filling a hardening type liquid between each of the load distribution plates and the setting floor after adjusting the leveling; and
   setting up the apparatus on the plurality of load distribution plates after the filled hardening type liquid is hardened,
   wherein the load distribution plates are made of a metal,
   wherein the load distribution plate is provided with a hole for releasing an air between the load distribution plate and the filled hardening type liquid at the time of filling the hardening type liquid, at a position contacting the apparatus.

5. A device manufacturing method comprising:
   exposing a pattern of an original onto a substrate using an exposure apparatus; and
   developing the exposed substrate, wherein the exposure apparatus comprises a plurality of load distribution plates for which a leveling adjustment has been performed, a setting leg which is set up on each of the load distribution plates, a platen on which an original stage configured to hold the original, the projection optical system, a substrate stage configured to hold the substrate, or a combination of some or all of the original stage, the projection optical system and the substrate stage is mounted, a mount which is provided between the platen and the setting leg and configured to reduce a vibration, and a filling member formed by filling and hardening a hardening type liquid between each of the load distribution plates and a setting floor after the leveling adjustment is performed by a bolt which holds each of the load distribution plates with respect to the setting floor,
   wherein the load distribution plates are made of a metal, and
   wherein the load distribution plate is provided with a hole for releasing an air between the load distribution plate and the filling member at the time of filling the hardening type liquid, at a position contacting the setting leg.

6. A device manufacturing method comprising:
   exposing a pattern of an original onto a substrate using an exposure apparatus; and
   developing the exposed substrate,
   wherein the exposure apparatus comprises a plurality of load distribution plates for which a leveling adjustment has been performed, a setting leg which is set up on each of the load distribution plates, the plurality of load distribution plates made of a metal or a resin on which the setting leg is set up, and a filling member formed by filling and hardening a hardening type liquid between each of the load distribution plates and a setting floor after the leveling adjustment is performed by a bolt which holds each of the load distribution plates with respect to the setting floor,
   wherein the load distribution plate is provided with a hole for releasing an air between the load distribution plate and the filling member at the time of filling the hardening type liquid, at a position contacting the setting leg.

7. A lithography apparatus configured to form a pattern onto a substrate, the lithography apparatus comprising:
   a plurality of load distribution plates for which a leveling adjustment has been performed;
   a setting leg which is set up on each of the load distribution plates;
   a platen on which a substrate stage configured to hold the substrate is mounted;
   a mount which is provided between the platen and the setting leg and configured to reduce a vibration; and
   a filling member formed by filling and hardening a hardening type liquid between each of the load distribution plates and a setting floor after the leveling adjustment is performed by a bolt which holds each of the load distribution plates with respect to the setting floor,
   wherein the load distribution plates are made of a metal,
   wherein the load distribution plate is provided with a hole for releasing an air between the load distribution plate and the filling member at the time of filling the hardening type liquid, at a position contacting the setting leg.

* * * * *